United States Patent
Cascino et al.

(10) Patent No.: US 8,334,576 B2
(45) Date of Patent: Dec. 18, 2012

(54) HIGH FREQUENCY MOS DEVICE AND MANUFACTURING PROCESS THEREOF

(75) Inventors: Salvatore Cascino, Gravina di Catania (IT); Maria Concetta Nicotra, Catania (IT); Antonello Santangelo, Belpasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 348 days.

(21) Appl. No.: 11/818,438

(22) Filed: Jun. 13, 2007

(65) Prior Publication Data

US 2007/0284673 A1   Dec. 13, 2007

(30) Foreign Application Priority Data

Jun. 13, 2006 (EP) .................................. 06425396

(51) Int. Cl.
*H01L 29/66* (2006.01)
(52) U.S. Cl. ........................ 257/409; 257/408
(58) Field of Classification Search .............. 257/296, 257/327, 341, 409, 408; 357/23, 41; 438/451, 438/592
See application file for complete search history.

(56) References Cited

U.S. PATENT DOCUMENTS

| | | | |
|---|---|---|---|
| 4,189,737 A | 2/1980 | Horninger | |
| 4,290,077 A | 9/1981 | Ronen | |
| 5,789,297 A * | 8/1998 | Wang et al. | 438/267 |
| 6,090,693 A * | 7/2000 | Gonzalez et al. | 438/592 |
| 6,222,229 B1 * | 4/2001 | Hebert et al. | 257/327 |
| 2006/0054954 A1 * | 3/2006 | Santangelo et al. | 257/296 |

FOREIGN PATENT DOCUMENTS

| | | |
|---|---|---|
| EP | 1 635 399 A1 | 3/2006 |
| WO | WO 00/49663 | 8/2000 |

OTHER PUBLICATIONS

H.F.F. Jos, "Novel LDMOS Structure for 2 GHz High Power Basestation Application", 28th European Microwave Conference Proceedings, Amsterdam, NL, vol. 1, Oct. 6, 2998.
European Search Report for EP 06425396 dated Dec. 22, 2006.
Michael Quirk, Julian Serda,"Semiconductor Manufacturing Technology", 2001, pp. 265-282, Prentice-Hall, Inc., Upper Saddle River, New Jersey, US.

* cited by examiner

*Primary Examiner* — Zandra Smith
*Assistant Examiner* — Marvin Payen
(74) *Attorney, Agent, or Firm* — Graybeal Jackson LLP

(57) ABSTRACT

MOS device formed in a semiconductor body having a first conductivity type and a surface and housing a first current-conduction region and a second current-conduction region, of a second conductivity type. The first and second current-conduction regions define between them a channel, arranged below a gate region, formed on top of the surface and electrically insulated from the channel region. A conductive region extends on top of a portion of the channel, adjacent to and insulated from the gate region only on a side thereof facing the first current-conduction region. The conductive region is biased so as to modulate the current flowing in the channel.

28 Claims, 7 Drawing Sheets

US 8,334,576 B2

HIGH FREQUENCY MOS DEVICE AND MANUFACTURING PROCESS THEREOF

PRIORITY CLAIM

This application claims priority from European patent application No. 06425396.6, filed Jun. 13, 2006, which is incorporated herein by reference.

TECHNICAL FIELD

An embodiment of the present invention relates, in general, to a MOS device and to the manufacturing process thereof. In particular, an embodiment of the invention relates to a MOS device that can be used as power amplifier for radio-frequency (RF) applications.

BACKGROUND

As is known, in applications at high frequency (for example, between some hundreds of MHz and some GHz) and high power, where the individual MOS devices supply powers comprised between fractions of a watt and some hundreds of watts, it is convenient to operate with supply voltages that may exceed 30 V. More in general, it is convenient, as the power requirement increases, to increase the voltage range across the device during operation. This range is limited by the drain-to-source breakdown voltage (Bvdss). For example, in amplifiers that operate in "class A" or "class B", the "instantaneous" drain-to-source voltage of the power MOS device may reach values that are twice that of the supply voltage. This implies that the drain-to-source breakdown voltage of the device must be in the region of 70 V, which may impose dimensional constraints on some important regions of the device.

Said constraints contrast, however, with the achievement of high dynamic performances. In fact, to achieve these performances may require the use of sub-micrometric gate lengths. These lengths are in fact commonly used for the same purpose in other technologies, such as, for example, CMOS technology, where, however, the above geometrical parameter is normally reduced at the expense of the supply voltage. A similar problem arises for the light-doped drain (LDD) region, which often is rendered longer, at the expense of the resistance that it offers to the passage of current, to withstand high voltages.

In addition to these contrasting requirements, operating at the high voltages referred to, well-known phenomena of electrical degradation, due to hot-carrier injection (HCI), may arise, which render it even more difficult to reach the compromise between the various requirements and which set a limit to the dynamic performance of the device.

In order to improve the dynamic performance, one may reduce the reaction capacitance Cgd between the gate and the drain of the device. In fact, by reducing this capacitance, it is possible to obtain an improvement in the figure of merit fmax (maximum oscillation frequency) or more in general in the power gain. In addition, the minimization of the variation in capacitance as the drain voltage varies reduces the intermodulation distortion generated by the device while amplifying a modulated signal. Since the power gain decreases as the operating frequency increases, a top limit is set to the frequency at which it is still convenient to use the device. In order to operate usefully at higher frequencies, it is then necessary to design the device so that it initially has a higher gain. Thereby, also at the maximum oscillation frequency fmax, it is able to operate with desired power gain.

Solutions are known to the art for reducing the intrinsic capacitive coupling between the gate electrode and the drain region and minimizing the hot-carrier phenomena, which, by causing charge trapping near the gate region, degrade the electrical performance of the device.

For example, the article "Novel LDMOS Structures for 2 GHz High Power Basestation Application" by H. F. F. Jos, 28th European Microwave Conference Proceedings, Amsterdam, NL, vol. 1, Oct. 6, 1998, which is incorporated by reference, describes a structure for reducing the gate-to-drain capacitance Cgd, which comprises a metal path referred to as "shield metal", which is defined, with a lithographic process, simultaneously to the gate metal and to the drain metal. This solution sets constraints on the length of the drain-extension region, since the shield-metal region must be defined within this space. In addition, the known solution does enable reduction of the capacitance between the drain metal and the gate metal, but is far from effective in reducing the intrinsic capacitance between the polysilicon gate electrode and the drain-extension region, which contributes also to the total gate-to-drain capacitance Cgd.

WO 00/49663 and EP-A-1 635 399, which are incorporated by reference, describe the formation of shield regions of a conductive material deposited only on one side of the gate region, on top of the drain region, thereby enabling a drastic reduction in the capacitive coupling between the gate electrode and the drain region.

In both solutions, it is disadvantageous that, when the drain-extension region is slightly depleted and consequently the neutral drain region is close to the gate electrode, there is an increase in the gate-to-drain parasitic capacitance, which is worsened by the fact that the thickness of the gate oxide, which separates the two regions referred to above, is normally of some tens of nanometers.

In the known solutions, then, the drain region is found in the proximity of the channel region underneath the gate region, when the latter is biased. The voltage applied to the drain has a marked influence on the channel region and consequently modulates the current of the device, giving rise, should the gate length not be sufficient, to the well-known short-channel effects.

SUMMARY

An embodiment of the invention overcomes one or more of the disadvantages presented by known solutions by providing a device having a high power gain and capable of operating properly at high operating frequencies.

BRIEF DESCRIPTION OF THE DRAWINGS

One or more embodiments of the invention are now described, purely by way of non-limiting example, with reference to the attached drawings, wherein.

DETAILED DESCRIPTION

Figure 1:
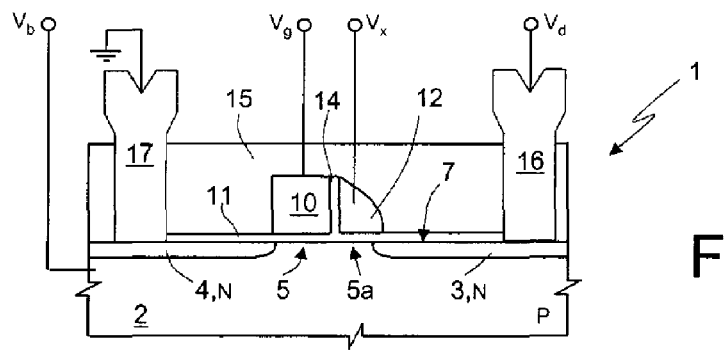
FIG. 1 shows a cross-section through a generic MOS device according to a first embodiment of the invention.

FIG. 1 shows the simplified structure of a device 1, defining a generic MOS device, in order to highlight the peculiar aspects of an embodiment of the invention.

In detail, the device 1 of FIG. 1 is formed in a body 2 of semiconductor material of P type having a surface 7 and housing a drain region 3, of N type, and a source region 4, of N+ type. The surface portion of the body 2 between the source region 4 and the drain region 3 constitutes a channel region 5.

A gate region or gate electrode 10 extends on top of the surface 7, overlying the channel 5, and is insulated from the body 2 by a gate-oxide layer 11. In particular, the gate region 10 is aligned on one side to the source region 4, and, on the opposite side, a conductive region 12 is set alongside it, electrically separated therefrom by a dielectric wall 14. An insulating layer 15 coats the body 2 and is passed by a drain metallization 16 in electrical contact with the drain region 3, and by a source metallization 17 in electrical contact with the source region 4.

As may be noted from FIG. 1, the drain region 3 is aligned with the conductive region 12. Consequently, a portion 5a of the channel region 5, adjacent to the drain region 3, is not overlaid by the gate region 10, but by the conductive region 12. Consequently, the channel region 5 has a length given approximately (but for lateral diffusions) by the sum of the length of the gate region 10 and the length of the conductive region 12 (as well as of the dielectric wall 14, which is negligible to a first approximation). Since the conductive region 12 can have a length of some hundreds of nanometers, a radical uncoupling is thus obtained between the drain region 3 and the gate region 10, with a minimization in their interaction.

In the geometrical conditions described and if the conductive region 12 is left floating or is connected to the drain metallization 17, which often constitutes the zero reference voltage, the device 1 is not able to operate properly and its electrical output characteristics are markedly penalized as compared to the case where the channel region 5 extends only underneath the gate region 10. Consequently, according to one embodiment of the invention, the conductive region 12 is biased at a voltage $V_x$ other than zero. In this way, it is possible to restore proper operation of the device 1 and simultaneously achieve the advantages resulting from its performances. In the particular case shown in FIG. 1, where the body 2 is of P type, the conductive region 12 is normally biased at a voltage higher than that of the source region 4. For example, if the source region 4 is taken as voltage reference ($V_S=0$ V), $V_x$ can be between 1 V and 15 V, for example between 2 V and 8 V, or, for example, between 5.5 V and 6.5 V.

Figure 2:
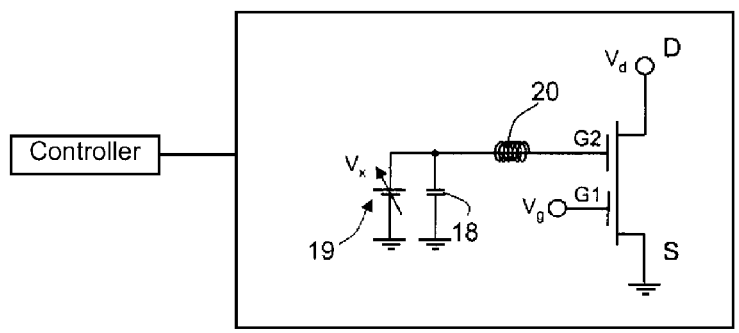
FIG. 2 shows an electrical circuit diagram including the device of FIG. 1.

Since, in order to bias the conductive region 12, an electrical connection of a finite length is provided, accompanied by a parasitic inductance, represented in the equivalent electrical circuit of FIG. 2 and designated by 20, it is convenient to connect dynamically the conductive region 12 to the reference voltage. In the large majority of cases, the reference voltage, often referred to as "ground", is defined by the source metallization 17. The conductive region 12 can hence conveniently be dynamically connected to ground through a capacitor 18, which can advantageously be integrated in the same silicon portion of the MOS device, using techniques known in the field of integrated circuits. This prevents the voltage of the conductive region 12 from varying dynamically, with respect to the value set from outside, on account of the capacitive couplings with the gate region 10 and the drain region 3. For example, the capacitor 18 can have a capacitance that is various times larger than the sum of the capacitance between the gate electrode 10 and the conductive region 12 and the capacitance between the conductive region 12 and the drain region 3. For a given parasitic inductance 20, the greater the capacitance of the capacitor 18, the smaller the dynamic voltage variation of the conductive region 12.

In FIG. 2, G1 designates the gate region 10, G2 designates the conductive region 12, D and S designate, respectively, the drain metallization 16 and the source metallization 17, $V_g$ designates the gate voltage, $V_d$ designates the drain voltage and $V_b$ designates the bulk voltage (body 2). In addition, a voltage source 19 is connected to the conductive region 12 (electrode G2) through the inductance 20, which represents, as has already been said, an external connection to the MOS device. In this situation, the conductive region 12 functions as shield for the gate region 10 both in regard of the drain region 3 and in regard of the drain metallization 16. Furthermore, thanks to the better distribution of the voltage within the drain region 3, the conductive region 12 may contribute to reducing the maximum electrical field to the advantage of a smaller generation of hot carriers and consequently in favor of a longer operating life of the device 1.

The voltage source 19 can be constant or variable. If the voltage source 19 is variable (as shown in FIG. 2), it enables variation of the voltage applied to the conductive region 12. By varying the voltage applied to the conductive region 12, it is possible to continuously modulate the electrical characteristics of the device 1 in order to dynamically control the power supplied by the amplifier, minimizing, if needed, the inductance 20 and eliminating the capacitance 18. Furthermore, the voltage modulation applied to the conductive region 12 may enable, for example, the best solution of compromise to be achieved between the static performance of the device and the dynamic performance.

At sufficiently low voltages of the drain region 3, such that this region is only slightly depleted, the positive biasing of the conductive region 12 can create an inversion layer densely populated by electrons within the portion 5a of the channel region 5 that extends underneath the conductive region 12. In this case, the conductive region 12 consequently operates like the gate of a MOS device of an enhancement type, which, in turn, is connected in series to the MOS transistor that has as a gate the gate region 10, providing continuity to the current flow of the resulting structure. In these conditions, the device 1 is thus comparable to a known dual-gate device.

As indicated, the density of the portion 5a can be modulated by suitably varying the voltage $V_x$, and its lateral distance from the gate region 10 can also be controlled by suitably varying the geometry of the system, for example, by changing the thickness of the dielectric wall 14 throughout the height of the wall or on a part thereof.

By increasing, for example, the thickness of the dielectric wall 14, the parasitic capacitance between the gate region 10 and the conductive region 12, which is connected dynamically to ground, is reduced, to the advantage of the total input capacitance Ciss of the device 1. By so doing, however, the inversion layer moves away from the gate region 10, penalizing the static performance of the device 1, whose current is reduced and can be maintained at the desired levels only by further increasing the voltage applied to the conductive region 12.

If the drain voltage 3 is increased so as to laterally deplete its portion close to the conductive region 12, then the inversion region created within the portion 5a of the channel region 5 cannot be formed, leaving, however, a drift region, which is able to collect the electrons coming from the side of the source region 4.

In practice, according to the specific application and the particular requirements, it is possible to define the geometrical parameters of the device 1 of FIG. 1 so as to achieve a suitable compromise. In particular, by acting on these parameters, it is possible to improve the dynamic performance of the device 1, such as, for example, the power gain, preserving the static parameters, such as, for example, the maximum current that the device 1 is able to conduct before it undergoes a reduction in performance, a parameter that may be important in RF power applications.

Figure 3:
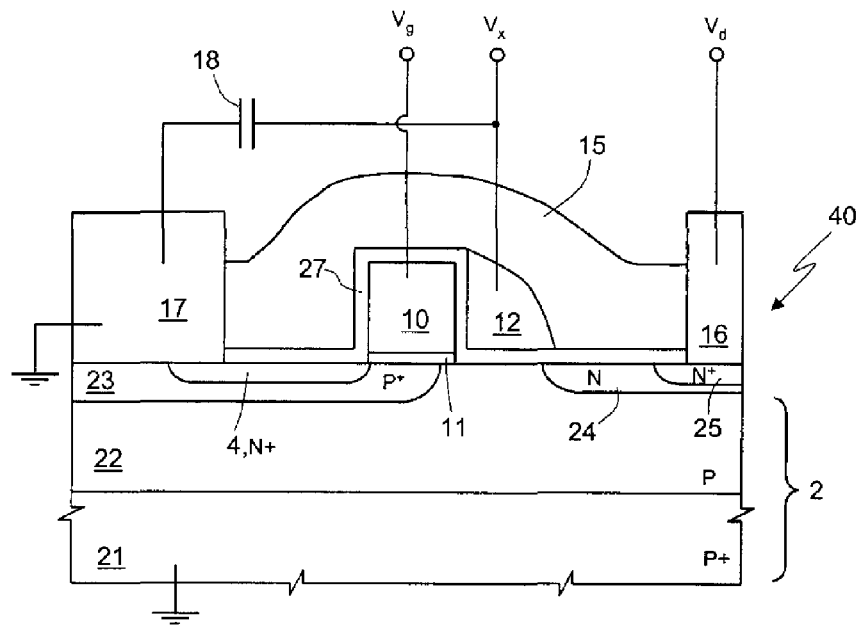
FIG. 3 shows a cross-section through an LDMOS device according to a first embodiment of the device of FIG. 1.

FIG. 3 shows the structure of a MOS transistor 40 of the power lateral type (LDMOS) and LDD type for applications in the RF field, using the concepts of FIG. 1 according to an embodiment of the invention. Consequently, parts that are the same in FIGS. 1 and 3 are designated by the same reference numbers.

In particular, FIG. 3 represents half of an elementary device, the complete structure whereof can be obtained by turning the structure of FIG. 3 over about its right-hand edge (drain metallization 16), and the entire MOS transistor 40 can be made up of a plurality of elementary devices.

The MOS transistor 40 is formed in a body 2 comprising a substrate 21 of a P+ type and an epitaxial layer 22 of a P type. The epitaxial layer accommodates a body region 23, of a P+ type, which extends underneath the gate region 10 up to the source metallization 17. The body region 23 accommodates the source region 4, of an N+ type. The epitaxial layer 22 moreover accommodates a drain-extension region 24 of an N− type, similar to the drain region 3 of FIG. 1 and thus having an edge aligned with the outer edge of the conductive region 12 (but for minor effects of lateral diffusion, which are easily controllable); in turn, the drain-extension region 24 accommodates a drain-contact region 25, of an N+ type.

A dielectric layer 27, for example of silicon oxide, surrounds the gate region 10 and forms the dielectric wall 14 of FIG. 1. The insulating layer 15 completely coats the body 2.

Indicatively, the thickness of the dielectric layer 27 can be chosen between 20 and 60 nm, the height of the conductive region 12 is approximately the same as that of the gate region 10, for example approximately 400 nm, and the width of the conductive region 12, in a horizontal direction, is between 200 and 500 nm and is, for example, approximately 300 nm.

Figure 4:
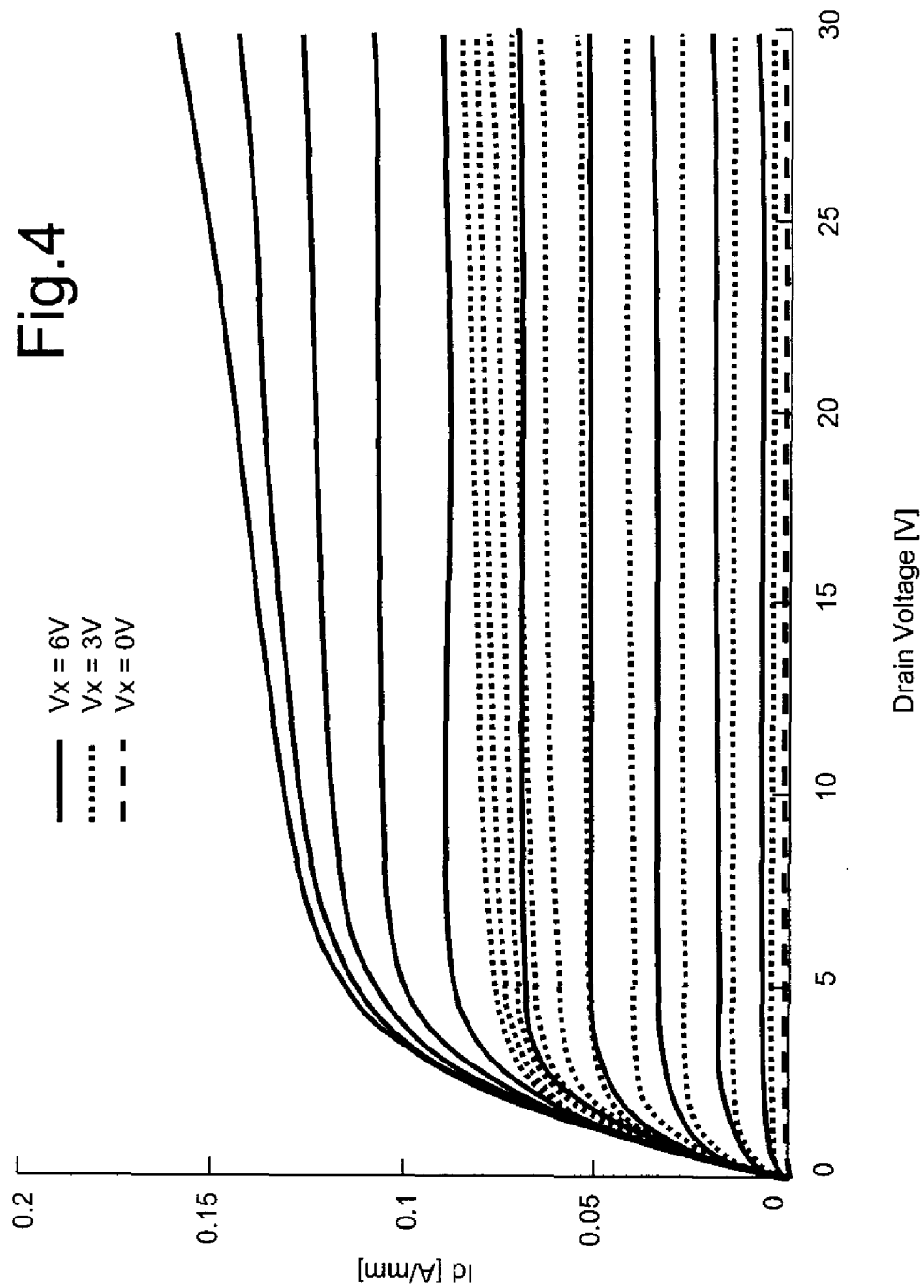
FIG. 4 shows the output characteristics of the device of FIG. 3.

FIG. 4 shows the output characteristics simulated for the MOS transistor 40 of FIG. 3, and in particular the plot of the drain current Id per unit perimeter as a function of the drain-to-source voltage Vds for three values of the voltage $V_x$ and as a function of the gate voltage $V_g$, which increases by steps of 0.5 V. As may be noted, in the case where the voltage $V_x$ is zero, the drain current Id is so small as not to be appreciable in the scale shown and merges with the horizontal axis.

Figure 5:
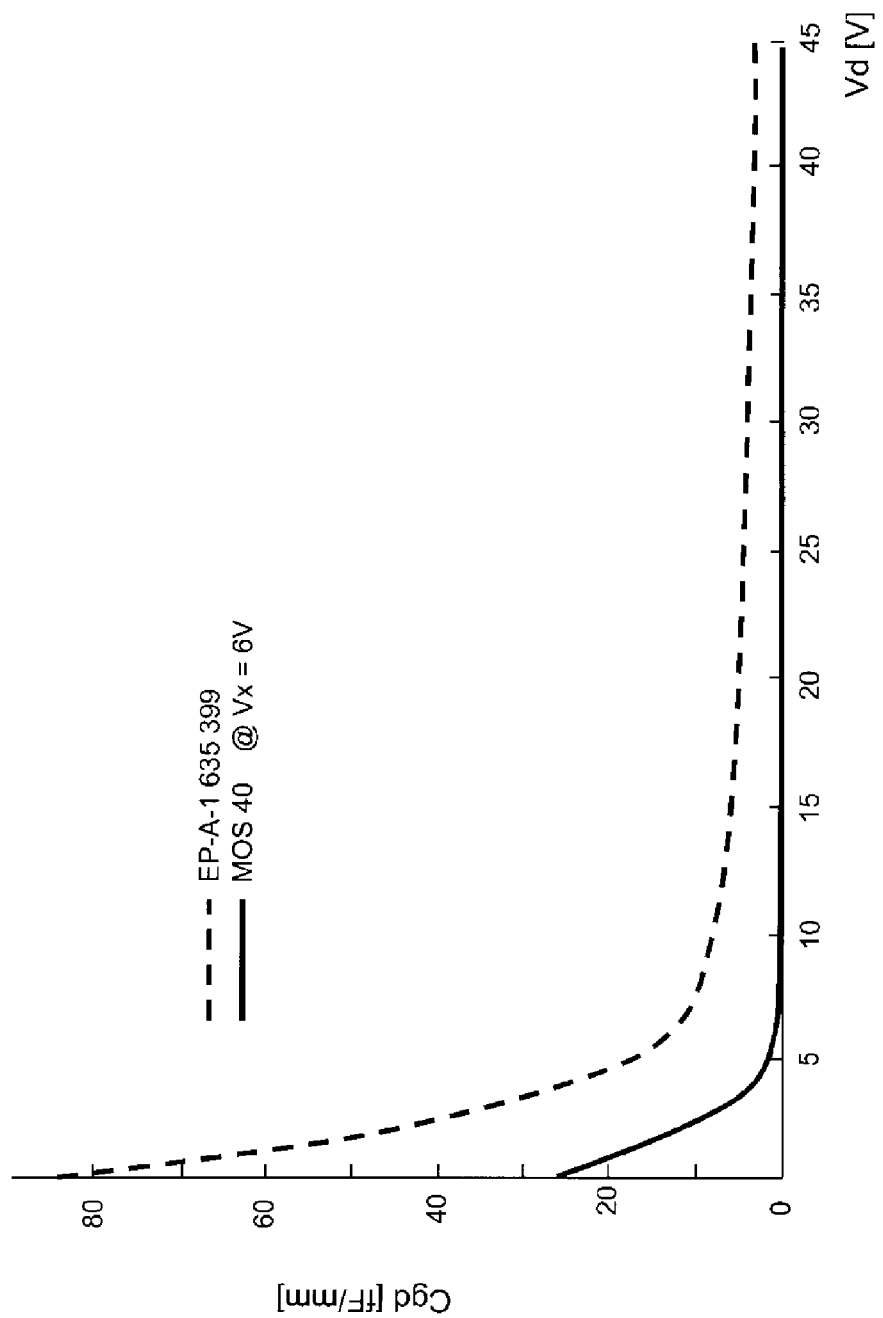
FIG. 5 shows the plot of the gate-to-drain capacitance of the device of FIG. 3.

FIG. 5 shows the variation per unit perimeter in the reaction capacitance Cgd between the gate and the drain for the MOS transistor 40 (solid line) and for a transistor obtainable according to the teachings of EP-A-1 635 399 (dashed line). As may be noted, with the MOS device 40 a constant and reduced value of the reaction capacitance Cgd is obtained for a wide range of the drain voltage Vd, starting from approximately Vd=5 V. As said, the maximum oscillation frequency fmax and the power gain of the device increase as the reaction capacitance Cgd decreases, thus showing an improvement in the dynamic behavior of the MOS transistor 40 as compared to a known solution. In addition, the reduction in the maximum swing of the capacitance for a given variation in the drain voltage improves the performance of the device in terms of intermodulation when the signal to be amplified is modulated.

The MOS device 40 of FIG. 3 is obtained as described hereinafter with reference to FIGS. 6-10.

Epitaxial region 22 is grown on the substrate 21, having a resistivity comprised between a few units and some tens of mΩcm, for example, between 5 mΩcm and 20 mΩcm, dopant concentrations in the range $10^{14}$-$10^{15}$ cm$^{-3}$ and thicknesses such that, at the end of all the thermal processes, the residual thickness of the epitaxial region 22 is in the range of a few microns.

In a per se known manner, the gate-oxide layer 11 (having a thickness of not more than 40 nm in one embodiment) and the gate region 10 are obtained on the surface of the body 2.

The gate region 10 is obtained by depositing a single polysilicon layer or using a polysilicon/silicide double layer.

After defining the gate-oxide layer 11 and the gate region 10, the body region 23 is implanted on one side of the gate region 10 within the epitaxial layer 22, in a self-aligned way to the gate region 10, with implantation doses in the range of 2-9×$10^{13}$ cm$^{-2}$. Next, the source region 4 and the drain-contact region 25 are implanted. For example, As is implanted at doses in the range of $10^{15}$ cm$^{-2}$ so as to minimize the contact resistance with the source metallization 17 and the drain metallization 16. The thermal processes necessary for activating and diffusing the implanted species can be performed at the end of each implantation process so as to maximize, for example, the degrees of freedom in forming the junctions. In particular, the contour of the body region 23 does not constitute a well defined boundary in so far as this portion is provided with a species that is homologous to that of the epitaxial region 22. In this way, thanks to the process of body ionic implantation and to the corresponding diffusion process, the semiconductor region underneath the gate region 10 is enriched with respect to its pre-existing background concentration.

Figure 6:
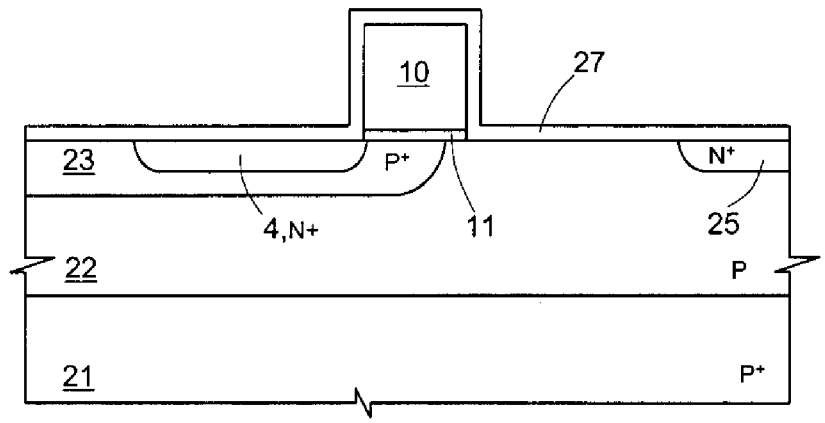
FIGS. 6-11 show cross-sections of the device of FIG. 3, in successive manufacturing steps.

Next, a dielectric layer 27, conveniently of silicon oxide, is deposited on the surface of the body 2 and has a thickness of a few tens of nanometers. In this way, the structure of FIG. 6 is obtained.

Then (FIG. 7), a conformal conductive material layer 30 is deposited by a chemical vapor deposition (CVD). This conformal conductive material can be constituted by a single material, such as, for example, tungsten or tungsten silicide, or else by two different materials, such as, for example, titanium nitride and tungsten or else polycrystalline silicon and tungsten silicide. Then (FIG. 8), the conformal conductive material layer 30 is anisotropically etched and remains only on the sides of the gate region 10, forming on one side the conductive region 12, on the opposite side a spacer region 12a (on top of the source region 4), and intermediate portions (not shown). In particular, the thickness of the conformal conductive material layer 30 is adjusted so that, after the anisotropic etch, the conductive region 12 has a width at the base in the range of some hundreds of nanometers.

According to EP-A-1 635 399, during anisotropic etching for forming the conductive region 12, it is possible to provide contact regions 33 (visible in FIG. 15 and arranged in a non-active area 34 of the device 40) starting from the same conformal conductive material layer 30, which contact regions allow electrically biasing of the conductive region 12.

Figure 9:
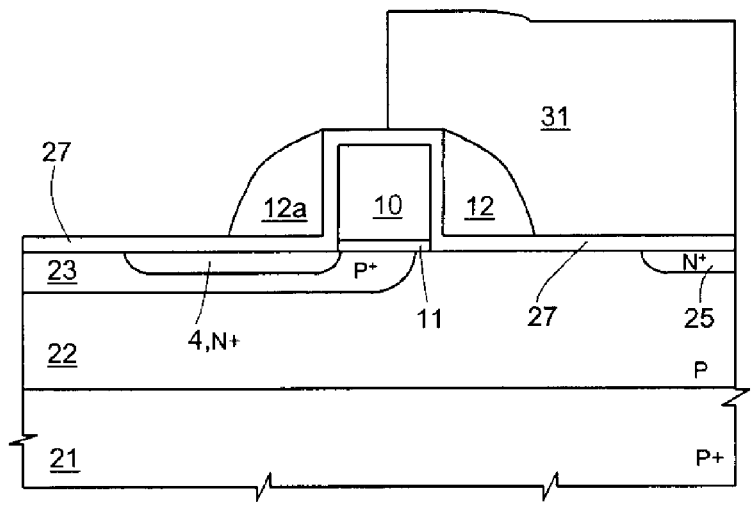
Figure 10:
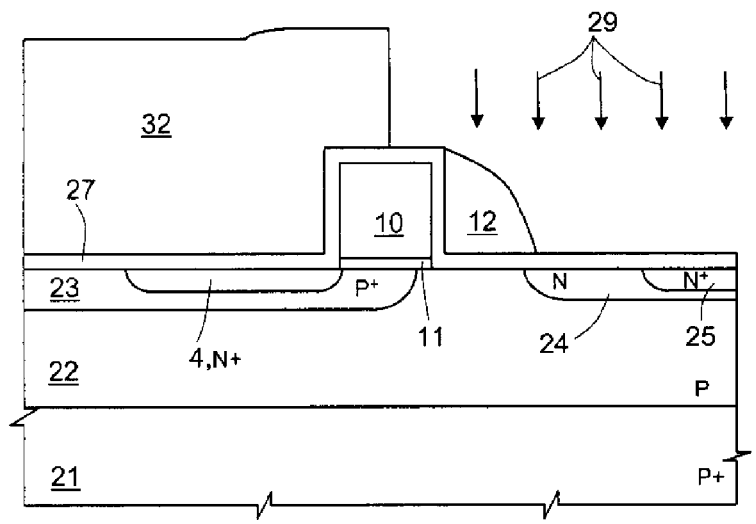

Next (FIG. 9), via a photolithographic process, a spacer mask 31 is provided, which covers the conductive region 12 but leaves the spacer region 12a exposed. Then, via an isotropic etch, the spacer region 12a is removed (FIG. 10).

Next, using a photolithographic process, an LDD mask 32 is provided, which covers the entire the surface of the body 2 except for the area where the drain-extension region 24 is to be implanted. Then, an implantation is performed with a species homologous to that of the source region 4 and drain region 25 using doses in the range of 0.5-4×$10^{12}$ cm$^{-2}$, as represented schematically in FIG. 10 by the arrows 29. The implantation is followed by a thermal process, which, for example, can be carried out by rapid thermal annealing (RTA), in order to activate the implanted species.

Figure 15:
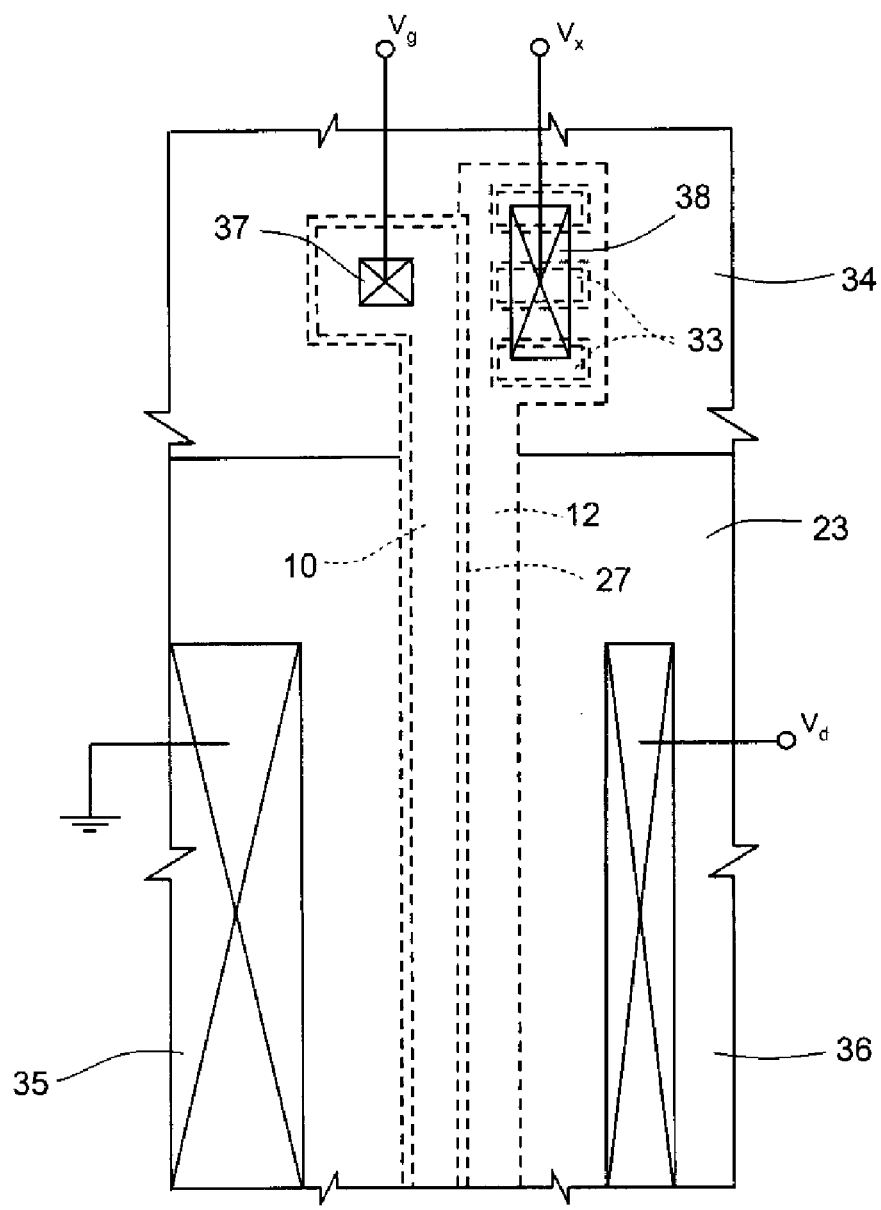
FIG. 15 is a top plan view of the device of FIGS. 3 and 14.

Finally, the insulating layer 15 is deposited and a photolithography is performed to open the source contact 35, the drain contact 36, and the gate contact 37 (FIG. 15). In addition, an auxiliary gate contact 38 is opened for electrical connection with the contact regions 33 and hence for biasing the conductive region 12, and the metallizations are provided, i.e., the drain metallization 16 and the source metallization 17, to obtain the final structure of FIG. 3.

In order to minimize the parasitic capacitance between the conductive region 12 and the gate region 10 and simultaneously maintain the functionality of the MOS device, it is possible to modify the manufacturing sequence with respect to what described with reference to FIGS. 6-10.

In particular, according to this second embodiment, the same steps described previously with reference to FIG. 6 are initially carried out. However, in this case, the deposition of the dielectric layer (27 in FIG. 6) is carried out using techniques designed to maximize the non-conformability. It is known, in fact, that the normally deposited dielectrics have a non-ideal "step-coverage", since the thickness deposited depends upon the surface morphology. In the presence of a step, the thickness grown on the wall thereof at its bottom end tends to be smaller than that grown on the horizontal surfaces. Normally, this is an undesirable effect and usually all the precautions necessary to minimize the phenomenon are taken. Adopting solutions that move in the opposite direction, it is consequently possible to deposit layers whose thickness, at the bottom end of the step, is as small as possible as compared to that of the dielectric layer grown on the plane surfaces. For example, in the case of an atmospheric-pressure chemical vapor deposition (APCVD), it is possible to intervene on the process temperature by reducing it so as to penalize mobility of the reagents adsorbed at the surface of the film being grown. The number of parameters on which it is possible to act is indeed very high, and also the techniques of deposition that can be chosen in order to obtain the above described effect are numerous, as is known to a person skilled in the art.

Figure 11:
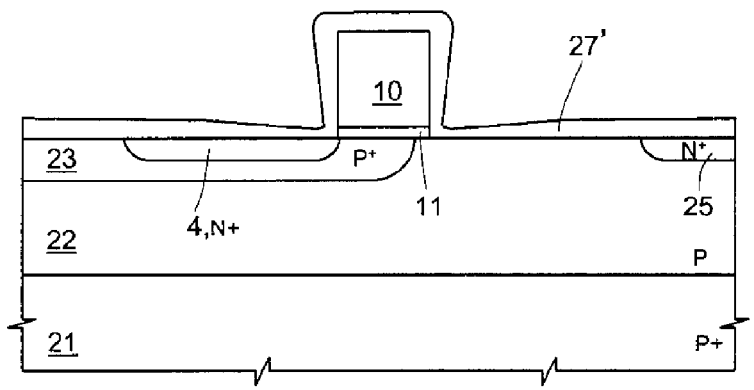

Consequently, using one of these techniques, as shown in FIG. 11, a dielectric layer is obtained, here designated by 27', having a minimum thickness at the base of the gate region 10 which is, for example, the same as the gate oxide 11 and gradually increases along the vertical sides of the gate region 10 moving in the direction of the top edge thereof as well as moving away from the gate region 10, on top of the surface 7 of the body 2.

Figure 7:
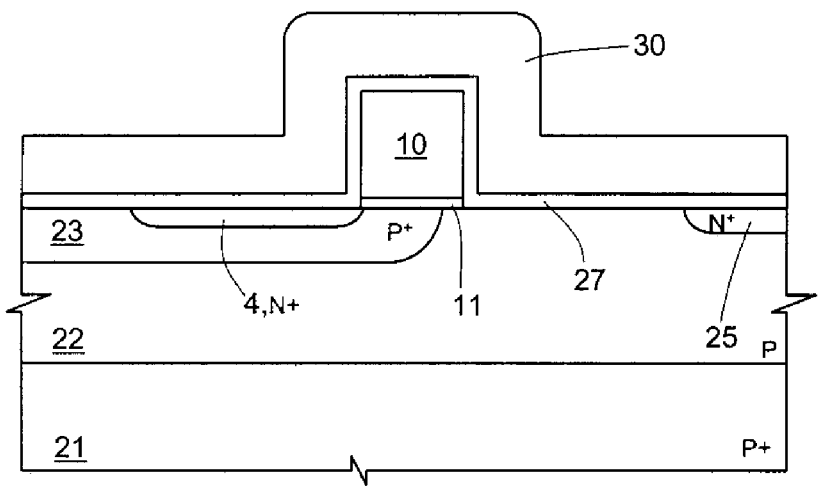
Figure 8:
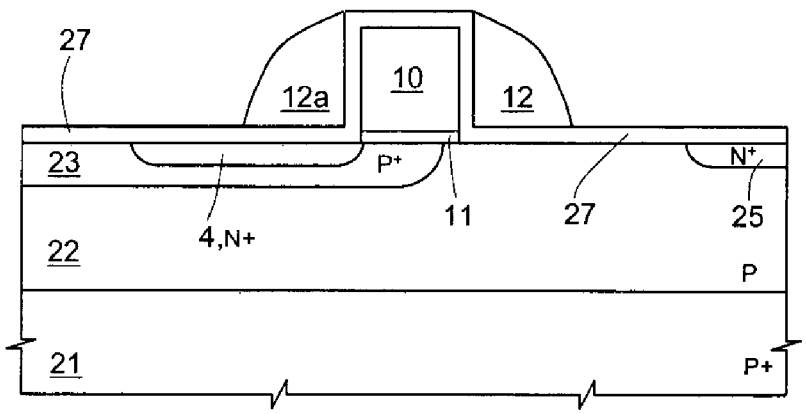
Figure 12:
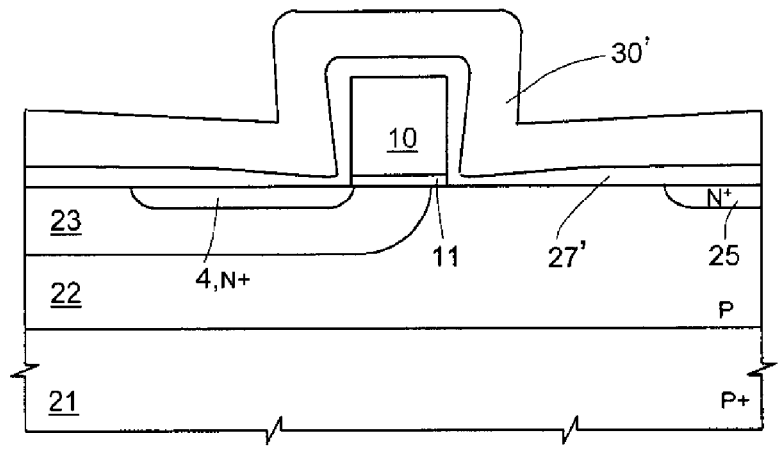
FIGS. 12-14 show cross-sections of a second embodiment of the device of FIG. 1, in successive manufacturing steps.
Figure 13:
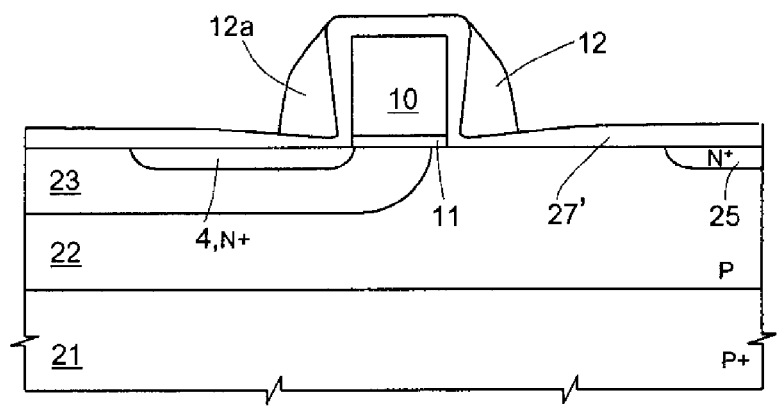
Figure 14:
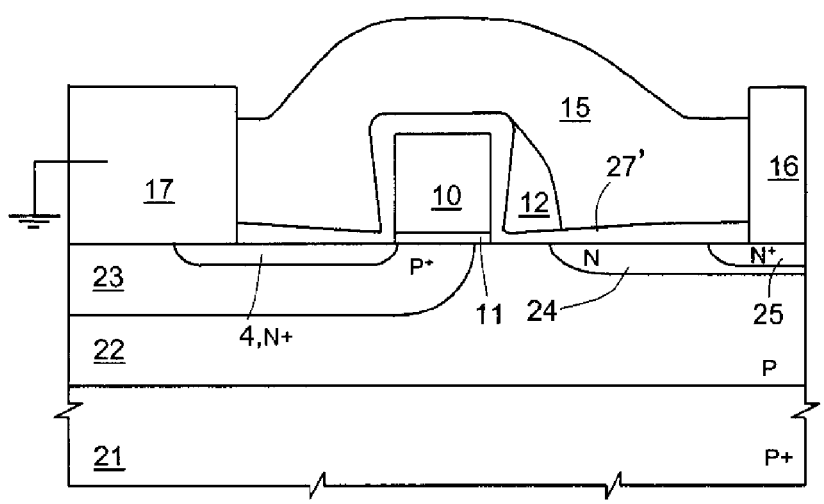

The subsequent steps are similar to those described with reference to FIGS. 7-9 and comprise: depositing the conformal conductive material layer 30', which thus follows the profile of the dielectric layer 27' (FIG. 12); anisotropic etch of the conformal conductive material layer 30', thereby forming the conductive region 12 and the spacer region 12a (FIG. 13); removing the spacer region 12a; masked implanting the drain-extension region 24; depositing the insulating layer 15; and opening the contacts and forming the drain metallization 16, the source metallization 17, the gate metallization and auxiliary gate metallization. Thereby, the final structure of FIGS. 14 and 15 is obtained.

In this way, thanks to the variable thickness of the dielectric layer 27' on the lateral wall of the gate region 10 at the side of the conductive region 12, the parasitic capacitance between the conductive region 12 and the gate region 10 is reduced as compared to the first embodiment (FIG. 3). In fact, the thickness of the dielectric 27' is greater than that of the layer 27, except for in the proximity of the bottom edge of the gate 10, where these thicknesses are comparable. In particular, the thickness of the dielectric 27' can reach, in the top portion of the gate region 10, a value even greater than twice that near the corresponding bottom edge. Simultaneously, the electrical functionality of the conductive region 12 is substantially unaffected, because, near the surface 7 of the body 2, the conductive region 12 is in a situation similar to that of FIG. 3.

Finally, it is clear that numerous modifications and variations can be made to the MOS device and to the manufacturing process described and illustrated herein, all of which fall within the scope of the invention.

In particular, the solution presented can be applied also to MOS devices of different type, with P channel (in which case the biasing voltage to be applied to the conductive region 12 is of an opposite sign with respect to the case described). For example, the present solution can be used for obtaining an NMOS transistor with CMOS technology.

One or more of the above-described transistors may be part of an electronic circuit, such as an amplifier, which may be part of a system such as a cell phone or wireless modem.

The invention claimed is:

1. A MOS device comprising:
   a semiconductor body having a first conductivity type and a surface;
   a first current-conduction region, having a second conductivity type, formed in the semiconductor body and facing the surface;
   a second current-conduction region, having said second conductivity type, formed in the semiconductor body and facing the surface;
   a channel region, having one and only one said first conductivity type, formed in the semiconductor body between said first current-conduction region and said second current-conduction region and having at least a portion facing said surface;
   a gate region, formed on top of said surface, electrically insulated from and overlying said channel region; and
   a conductive region extending only on one side of said gate region, facing said first current-conduction region, said conductive region being electrically insulated from said gate region,
   wherein said conductive region extends over the portion of said channel region that is facing the surface; and
   wherein said gate region comprises lateral surfaces extending between respective bottom and top edges, and a dielectric layer surrounds said gate region, said dielectric layer having a thickness near said bottom edges that is smaller than at said top edges.

2. The device according to claim 1, comprising an electrode for biasing said conductive region.

3. The device according to claim 2, wherein said first conductivity type is of P type and said second conductivity type is of N type, wherein said biasing electrode is connected to biasing means supplying a positive voltage with respect to said second current-conduction region.

4. The device according to claim 2, comprising a d.c.-voltage source connected to said biasing electrode.

5. The device according to claim 3, wherein said second current-conduction region is connected to a reference-voltage region and said positive voltage is between 1 V and 15 V, between 2 V and 8 V, or between 5.5 V and 6.5 V, with respect to said reference-voltage region.

6. The device according to claim 2, comprising a variable-voltage source connected to said biasing electrode.

7. The device according to claim 1, wherein said first current-conduction region is aligned to said conductive region.

8. The device according to claim 1, wherein said first current-conduction region is a drain region and said second current-conduction region is a source region.

9. The device according to claim 8, forming an LDMOS transistor, wherein said first current-conduction region comprises a drain-extension region, having a first doping level and aligned to said conductive region, and a drain-contact region, accommodated within said drain-extension region and having a second doping level higher than said first doping level.

10. The device according to claim 9, wherein said semiconductor body comprises an epitaxial layer having said first conductivity type and a third doping level, the device further comprising a body region accommodated in said epitaxial layer and surrounding said source region, said body region extending underneath said gate region and having said first doping type and a fourth doping level higher than said third doping level, wherein said epitaxial layer has a portion facing said surface of said semiconductor body, set underneath said conductive region, between said body region and said drain-extension region.

11. The device according to claim 1, wherein said gate region is at least partially of polycrystalline silicon and said conductive region is of a material chosen from among tungsten, tungsten silicide, double layer of titanium nitride/tungsten and double layer of polycrystalline silicon/tungsten silicide.

12. The device according to claim 1, wherein said conductive region has a length comprised between 200 nm and 500 nm.

13. The device according to claim 1, further comprising a capacitor connected between said conductive region and a reference-voltage region.

14. A transistor, comprising:
a layer having one and only one first conductivity and first and second contiguous surface portions;
a source region having a second conductivity and disposed in the layer adjacent to the first portion;
a drain region having the second conductivity and disposed in the layer adjacent to the second portion;
a gate region disposed over the first portion of the layer; and
a conductive region disposed over the second portion of the layer and isolated from the gate portion by a dielectric having a diminishing thickness, wherein the thickness of the dielectric close to the surface portions is smaller than the thickness further from the surface portions.

15. The transistor of claim 14, further comprising:
a substrate having the first conductivity; and
wherein the layer is disposed over the substrate.

16. The transistor of claim 14 wherein:
the first conductivity comprises a P-type conductivity; and
the second conductivity comprises an N-type conductivity.

17. The transistor of claim 14, further comprising:
a first electrical insulator disposed between the gate region and the conductive region; and
a second electrical insulator disposed between the layer and the gate and conductive regions.

18. The transistor of claim 14, further comprising:
a first electrical insulator disposed between the gate region and the conductive region and having a thickness that varies as a function of distance from the layer; and
a second electrical insulator disposed between the layer and the gate and conductive regions.

19. The transistor of claim 14, further comprising:
a body region having the first conductivity and disposed in the first surface portion and extending out of the first surface portion away from the second surface portion; and
wherein the source region is disposed in the body region.

20. The transistor of claim 14 wherein the source region includes:
a first portion having a first dopant concentration; and
a second portion disposed between the first surface portion and the first-portion and having a second dopant concentration that is lower than the first dopant concentration.

21. The transistor of claim 14, further comprising a capacitor disposed between the conductive region and the source region.

22. The transistor of claim 14, further comprising:
a source electrode coupled to the source region;
a drain electrode coupled to the drain region;
a gate electrode coupled to the gate region; and
a bias electrode coupled to the conductive region.

23. An electronic circuit, comprising:
a transistor, including, a layer having one and only one first conductivity and first and second contiguous surface portions,
a first source/drain region having a second conductivity and disposed in the layer adjacent to the first portion,
a second source/drain region having the second conductivity and disposed in the layer adjacent to the second portion,
a gate region disposed over the first portion of the layer,
a conductive region disposed over the second portion of the layer;
an isolation layer disposed between the gate region and the conductive region having a varying thickness, wherein the thickness of the isolation layer close to the surface portions is smaller than the thickness further from the surface portions; and
an electronic component coupled to the transistor.

24. The electronic circuit of claim 23, further comprising:
a reference node; and
a bypass capacitor coupled between the reference node and the conductive region.

25. A system, comprising:
an electronic circuit, including,
a transistor, including,
a layer having one and only one first conductivity and first and second contiguous surface portions,
a first source/drain region having a second conductivity and disposed in the layer adjacent to the first portion,
a second source/drain region having the second conductivity and disposed in the layer adjacent to the second portion,
a gate region disposed over the first portion of the layer,
a conductive region disposed over the second portion of the layer, and
an isolation layer disposed between the gate region and the conductive region having a varying thickness, wherein the thickness of the isolation layer close to the surface portions is smaller than the thickness further from the surface portions; and
an electronic component coupled to the transistor; and
a controller coupled to the electronic circuit.

26. The transistor of claim 14, further comprising an electrode for biasing the conductive region.

27. The transistor of claim 26, further comprising a variable-voltage source connected to the biasing electrode.

28. The transistor of claim 18 wherein the thickness of the first electrical insulator is inversely proportional to the distance of the first electrical insulator from the layer.

* * * * *